United States Patent [19]

Fuchi

[11] Patent Number: 5,134,375
[45] Date of Patent: Jul. 28, 1992

[54] RELAY CHECKING DEVICE

[75] Inventor: Tatsuo Fuchi, Oita, Japan

[73] Assignee: Kabushiki Kisha Toshiba, Kawasaki, Japan

[21] Appl. No.: 674,905

[22] Filed: Mar. 26, 1991

[30] Foreign Application Priority Data

Mar. 27, 1990 [JP] Japan .................................. 2-77444

[51] Int. Cl.⁵ ...................... G01R 31/32; G01R 31/02
[52] U.S. Cl. ............................... 324/419; 324/121 R; 324/418; 324/423; 340/644
[58] Field of Search .................... 324/96, 121 R, 415, 324/418, 419, 423; 340/644

[56] References Cited

U.S. PATENT DOCUMENTS 4,147,977 4/1979 Dimmick ........................ 324/121 R
4,479,117 10/1984 Marquardt ......................... 340/644

OTHER PUBLICATIONS

Heilweil et al., "Testing Electromagnetic Switching Devices", IBM Technical Disclosure Bulletin, vol. 9, No. 4, Sep. 1966, p. 367.

Primary Examiner—Kenneth A. Wieder
Assistant Examiner—Diep Do
Attorney, Agent, or Firm—Foley & Lardner

[57] ABSTRACT

A relay device having a relay element mounted on a circuit board, the relay element having a pair of contacts which are closed and electrically conducted by a control signal of a first level and opened by the control signal of a second level to form a contact gap; an LED for emitting light toward the contact gap; a phototransistor for receiving light from the LED, the phototransistor not receiving the light while the pair of contacts are closed, and receiving the light passing through the contact gap while the pair of contacts are opened; and a checker circuit for checking if the relay device operates normally or abnormally in accordance with the relationship between an output from the phototransistor and the level of the control signal.

14 Claims, 3 Drawing Sheets

RELAY CHECKING DEVICE

FIELD OF THE INVENTION

The present invention relates to a relay device, and more particularly to a relay device equipped with a checker for checking if a relay element operates normally or abnormally.

BACKGROUND OF THE INVENTION

Semiconductor switches have been used recently in place of relays with mechanical contacts because of their excellent reliability, durability, response speed and the like. On the other hand, a relay has the advantageous characteristics of a small on-resistance and a small parasitic capacitance (capacitance between contacts, capacitance between contacts and driving coil). For this reason, a mechanical relay is necessarily used in a measuring circuit of a tester and the like.

However, since a relay has mechanically operating contacts, there is a large possibility of trouble and operation error when compared with other components such as semiconductor switches. Such troubles and unstable operation immediately before the troubles result in a lower availability rate and reliability of a tester.

It is necessary to check the operation of a relay. The operation of a relay has been checked conventionally by connecting it as shown in FIG. 1. As shown in FIG. 1, a relay 16 is constructed of a relay coil 4 and relay contacts 18 which are electromagnetically opened and closed when the relay coil 4 is energized.

The on/off of the relay coil 4 is controlled by a relay driver power source 17 and a relay driver 21. The relay contacts 18 are connected to a contact on-off detecting power source 19 and a contact on-off detecting voltage meter 20. With this arrangement, when the relay contacts 18 become in contact with each other, a voltage across the contact on/off detecting power source 19 is applied via the relay contacts 18 to the contact on/off detecting voltage meter 20.

In checking the operation of each relay, the relay coil 4 is first energized upon operation of the relay driver 21, and then the operation of the contact on-off detecting voltage meter 20 is checked. In this manner, it becomes possible to discriminate between the normal operation and the abnormal operation of the relay 16.

It is essential to check the operation of a relay in the manner such as described above, in order to ensure the reliability of a tester which measures the performance of semiconductors, instruments, or the like. The operation of a relay already mounted on an apparatus is carried out at present in the following manners.

(1) A subject relay is removed from a tester, and it is checked in the manner as described with FIG. 1 if the relay is malfunctioning.

(2) A circuit board on which a subject relay is mounted is removed from a tester. The operation of the circuit board is checked using a board checker.

(3) A dedicated relay check program is made while considering the function of a d.c. measuring circuit portion of a tester. The on-off of a subject relay is checked by flowing a current through the relay contacts.

A single tester is generally equipped with several hundreds of relays. In view of this fact, the above methods (1) and (2) have a poor operation efficiency, and require a very long time. Furthermore, there is the associated problem that a tester cannot be used while it is being checked. The method (3) provides a good operation efficiency because a relay or board does not have to be removed from the tester. However, it involves a contradiction in that a tester uses the relay itself in checking the operation of the relay, resulting in a poor reliability. Furthermore, in checking the operation of a relay, a current is caused to flow through the relay contacts. Therefore, the tester is required to stop its operation, resulting in a low availability rate. Still further, a relay may enter an unstable state even before a definite malfunction. In such a case, the relay operates normally at one time and abnormally at another time. In other words, it is not infrequent that an operation error occurs between several normal operations. It can be considered in some cases that even if a relay operated normally at the time of checking, it may operate abnormally at the stage of practical use. Namely, even if a check is made, the possibility of abnormal operation cannot be excluded.

SUMMARY OF THE INVENTION

The present invention has been made in consideration of the above problems. It is an object of the present invention to provide a relay device which allows an external check of the mechanical operation of the relay contacts while being operated.

According to one aspect of the present invention, there is provided a relay device comprising:

a relay element mounted on a circuit board, the relay element having a pair of contacts which are closed and electrically conducted by a control signal of a first level and opened by the control signal of a second level to form a contact gap;

light emitting means for emitting light toward the contact gap;

light receiving means for receiving light from the light emitting means, the light receiving means not receiving the light while the pair of contacts are closed, and receiving the light passing through the contact gap while the pair of contacts are opened; and checking means for checking if the relay device operates normally or abnormally in accordance with the relationship between an output from the light receiving means and the level of the control signal.

DESCRIPTION OF THE PREFERRED EMBODIMENTS

Preferred embodiments of this invention will be described with reference to the accompanying drawings.

Figure 1:
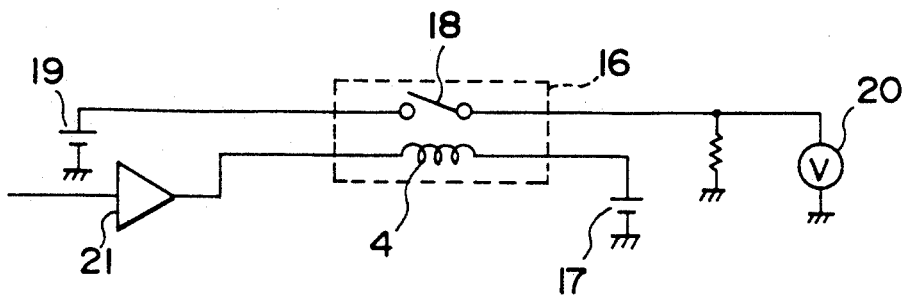
FIG. 1 is a circuit diagram used for checking the operation of a conventional relay.
Figure 2:
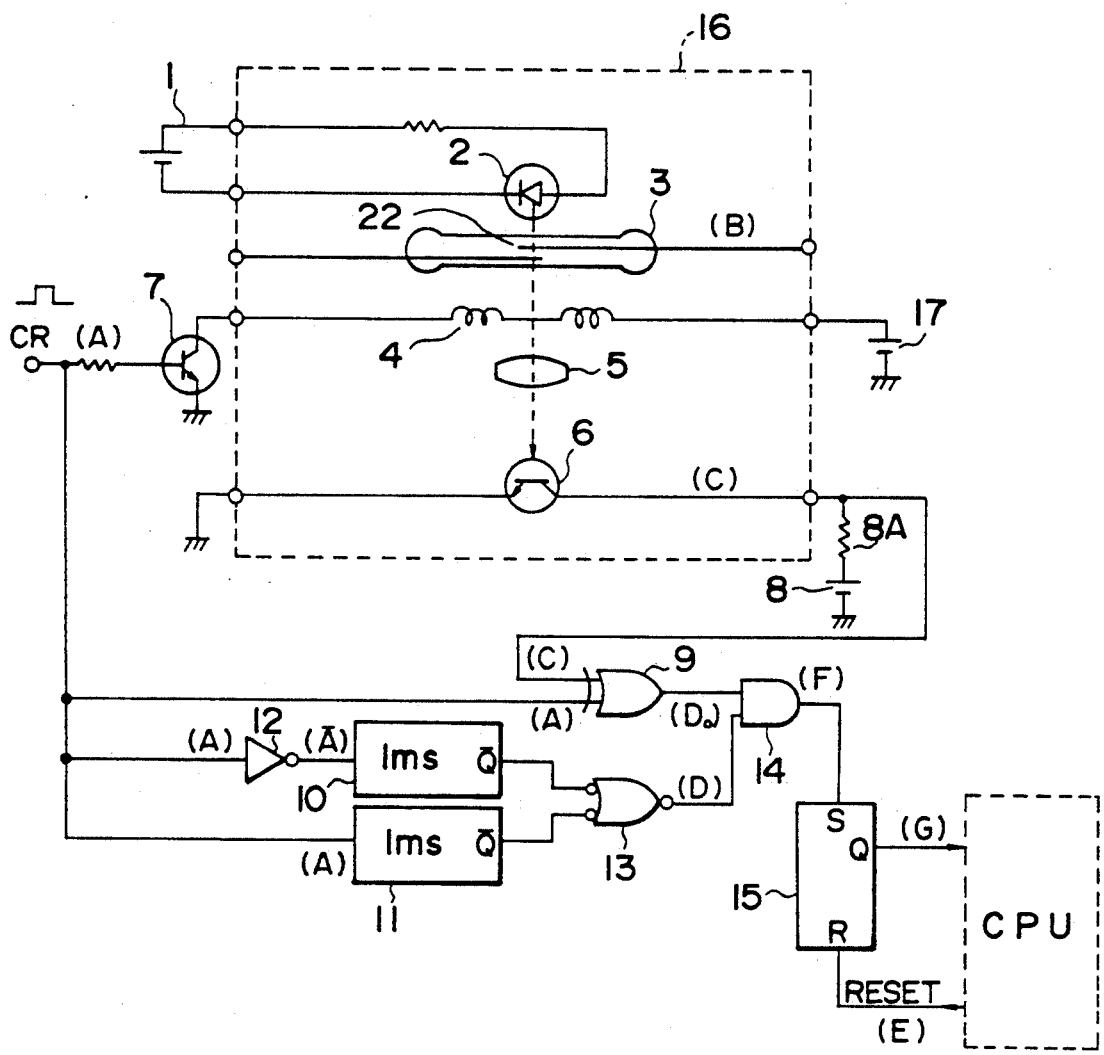
FIG. 2 is a circuit diagram used for checking the operation of a relay element of the relay device according to an embodiment of this invention.

FIG. 2 is a circuit diagram of the relay device according to an embodiment of this invention. As shown in FIG. 2, a relay unit 16 is a unit having various circuit elements mounted on a circuit board. This unit 16 has a reed switch (relay element) 3 and a relay coil 4 for electromagnetically driving the reed switch 3. The relay unit 16 further includes an LED 2 and a phototransistor 6 as a light receiving sensor. The LED 2 emits light toward the contact gap 22 of the reed switch 3. The phototransistor 6 receives the light which was emitted from the LED 2, passed through the contact gap 22, and converged by a condenser lens 5. The LED 2 is powered by an LED power source 1 and always maintained turned on. The relay coil 4 is connected between a relay driving power source 17 and a relay driver transistor 7. When the transistor 7 is turned on by a control signal CR, current will flow from the relay driving power source 17 to the relay coil 4, so that the reed switch 3 is driven by the electromagnetic force radiated from the reed relay coil 4. The light receiving sensor phototransistor 6 is connected via a phototransistor load resistor 8A to a power source 8. The phototransistor 6 turns on when light from the LED 2 is incident to the phototransistor 6 via the contact gap 6 and condenser lens 5, to thereby produce an L level signal at one input terminal of an Exclusive-OR gate 9. On the other hand, if light from the LED 2 is intercepted in reaching the phototransistor 6, the phototransistor 6 turns off, to thereby produce an H level signal at the one input terminal of the Exclusive-OR gate 9. To the other input terminal of the Exclusive-OR gate, the control signal CR is applied. If the output level of the control signal CR is different from the output level of the phototransistor 6, the Exclusive-OR gate 9 outputs an H level signal. Namely, the Exclusive-OR gate 9 outputs an H level signal when the control signal CR takes an L level and the phototransistor 6 outputs an H level signal, or when the control signal CR takes an H level and the phototransistor 6 outputs an L level signal. The control signal CR is inputted to a monostable circuit 10 via an inverter 12. This monostable circuit 10 outputs an L level signal for a predetermined period, e.g., 1 ms, starting from the leading edge of the output of the inverter circuit 12, i.e., the trailing edge of the control signal CR. The control signal CR is also inputted to another monostable circuit 11. This monostable circuit 11 outputs an L level signal for a predetermined period, e.g., 1 ms, starting from the leading edge of the control signal CR. The outputs of the monostable circuits 10 and 11 are inputted to an AND gate 13. This AND gate 13 outputs an L level signal for a predetermined period (1 ms) starting from the leading and trailing edges of the control signal CR, the output of the AND gate 13 being applied to one input terminal of an AND gate 14. The period of the L level signal outputted from the AND gate 13 corresponds to a sum of the response time of the reed switch 3 for turning on or off and the time required for the chattering to decay. The other input terminal of the AND gate 14 is connected to the output terminal of the Exclusive-OR gate 9. When the AND gate 14 receives an H level signal from the Exclusive-OR gate 9 and an H level signal from the AND gate 13, it outputs an H level signal to an S input terminal of an SR flip-flop circuit 15 which is set accordingly. The Q output of the SR flip-flop circuit 15 is applied to a CPU on the tester side. This CPU checks if the relay unit 16 operates normally or abnormally. The CPU on the tester side supplies a RESET signal to the R input terminal of the SR flip-flop circuit 15 to reset the circuit 15.

Figure 3:
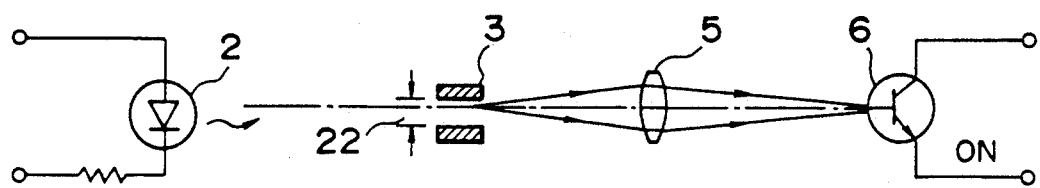
FIG. 3 illustrates the operation of the relay unit used in the relay device shown in FIG. 2 when the contact gap is open.
Figure 4:
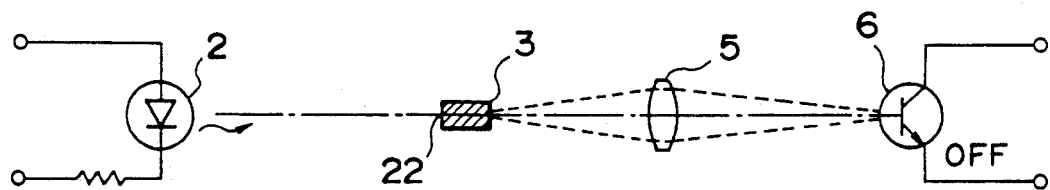
FIG. 4 illustrates the operation of the relay unit used in the relay device shown in FIG. 2 when the contact gap is closed.
Figure 5:
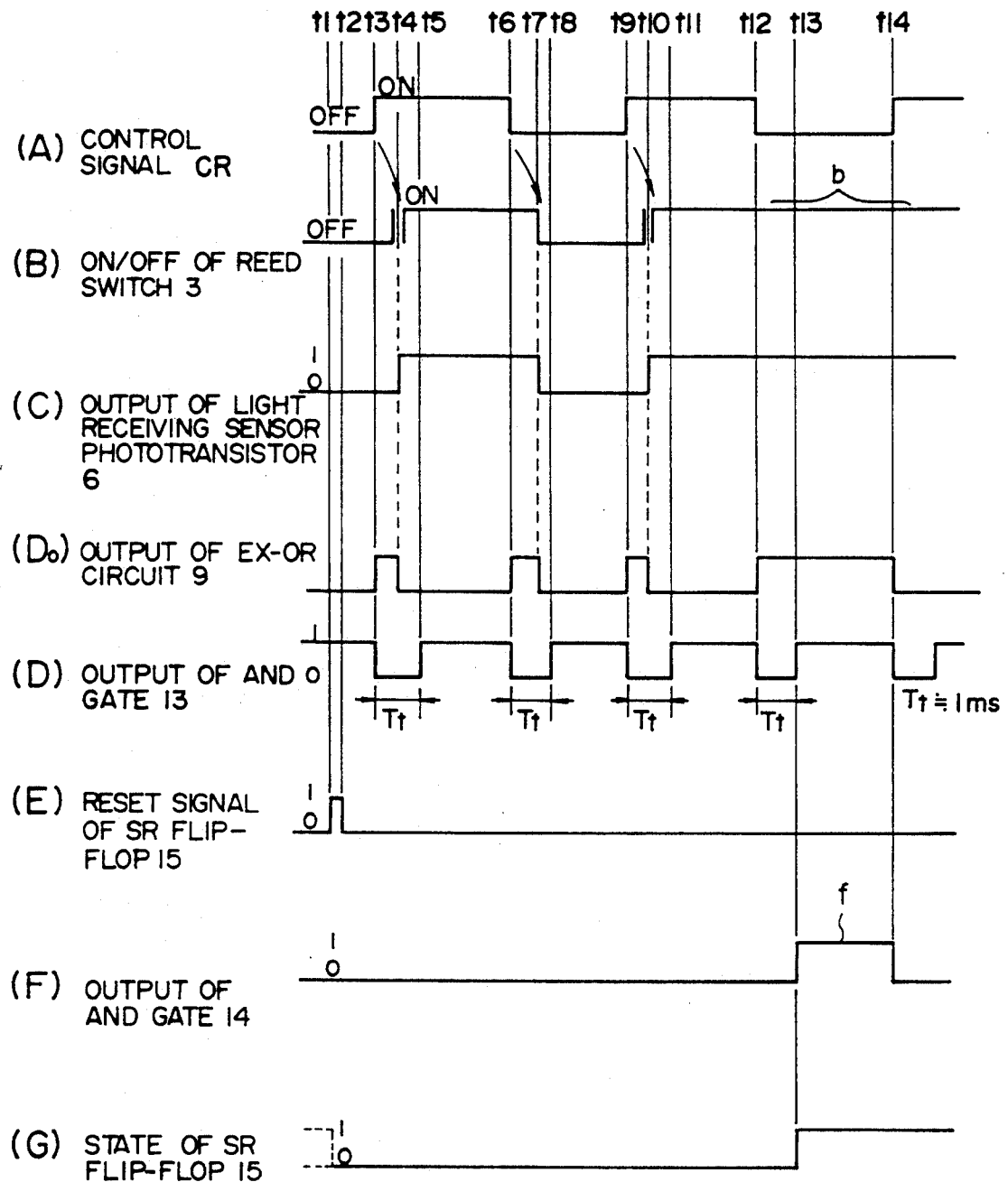
FIG. 5 is a timing chart illustrating the operation of the relay device shown in FIG. 2.

The operation of the relay device shown in FIG. 2 will be described below with reference to FIGS. 3 to 5. FIGS. 3 and 4 illustrate the states of the relay unit 16, and FIG. 5 is a timing chart showing the details of the operation.

If the control signal CR takes an L level and the relay unit 16 is normal, the following operation is performed. The driver transistor 7 is first turned off so that current will not flow through the relay coil 4 and the read switch 3 is maintained off. In this condition, therefore, the contact gap 22 of the reed switch 3 is open. This condition is shown in FIG. 3. As a result, light from the LED 2 is incident to the phototransistor 6 via the contact gap 22 and condenser lens 5 to turn on the phototransistor 6.

On the other hand, if the control signal CR takes an H level and the relay unit 16 is normal, the following operation is performed. The driver transistor 7 is first turned on so that current will flow from the relay driver power source 17 to the relay coil 4 and the read switch 3 turns on. In this condition, therefore, the contact gap 22 of the reed switch 3 is closed. This condition is shown in FIG. 4. As a result, light from the LED 2 is intercepted by the closed contact gap 22 and is not incident to the phototransistor 6 to thereby turn off the phototransistor 6.

In checking the operation of the relay unit 16, the CPU on the tester side first outputs a RESET signal for the period from time t1 to t2 to thereby reset the SR flip-flop circuit 15 and initialize it. It is assumed as shown in FIG. 5(A) that the control signal CR takes an L level until time t3, an H level for the period from time t3 to t6, an L level for the period from time t6 to t9, an H level for the period from time t9 to t12, an L level for the period from time t12 to t14, and an H level after time t14.

When the control signal CR changes its level from an L level to an H level at time t3, the driver transistor 7 turns on so that current flows from the power source 17 to the relay coil 4. The control signal CR is inputted also to the monostable circuit 11. The circuit 11 outputs an L level signal having a time duration Tt for the period from time t3 to t5. This time duration Tt corresponds to a sum of the response time of the relay unit 16 and the time required for the chattering to decay. This L level signal is inputted to the AND gate 13. The AND gate 13 supplies an L level signal (FIG. 5 (D)) to the AND gate 14 for the predetermined time period Tt. The reed switch 3 turns on at time t4 during the time period from time t3 to t5, to thereby close the contact gap 22. As a result, the phototransistor 6 turns off, and the H level signal is supplied to the Exclusive-OR gate 9. Receiving the H level control signal CR and the H level signal of the phototransistor 6, the Exclusive-OR gate 9 outputs an L level signal (FIG. 5 (Do)). The AND gate 14 therefore outputs an L level signal (FIG. 5 (F)). The SR flip-flop circuit 15 is maintained in its reset state (FIG. 5 (G)).

When the control signal CR takes an L level at time t6, the driver transistor 7 turns off so that the current having been supplied to the relay coil 4 from the power source 17 is intercepted. The control signal CR is also supplied to the inverter circuit 12. The monostable circuit 10 connected to the inverter circuit 12 outputs an L level signal having a time duration Tt for the period from time t6 to t8. This time duration Tt corresponds to a sum of the response time of the relay unit 16 and the time required for the chattering to decay. This L level signal is inputted to the AND gate 13. The AND gate 13 supplies an L level signal (FIG. 5 (D)) to the AND gate 14 for the predetermined time period Tt. The reed switch 3 turns off at time t7 during the time period from time t6 to t8, to thereby open the contact gap 22. As a result, the phototransistor 6 turns on, and the output thereof takes an L level. Receiving the L level control signal CR and the L level signal of the phototransistor 6, the Exclusive-OR gate 9 outputs an L level signal. The output of the AND gate 14 therefore holds the L level. The SR flip-flop circuit 15 is therefore maintained in its reset state.

When the control signal CR takes an H level at time t9, the driver transistor 7 turns on so that current flows to the relay coil 4. The monostable circuit 11 inputted with the control signal CR outputs an L level signal having a time duration Tt for the time period from time t9 to t11, and supplies the L level signal to the AND gate 13. The AND gate 13 supplies an L level signal to the AND gate 14 for the predetermined time period Tt. The reed switch 3 turns on at time t10, to thereby close the contact gap 22. As a result, the phototransistor 6 turns off to output an H level signal. Receiving the output signal of the phototransistor 6 and the control signal CR, the Exclusive-OR gate 9 outputs an L level signal. Therefore, the output of the AND gate 14 maintains the L level, and the SR flip-flop circuit 15 maintains the reset state.

When the control signal CR takes an L level at time t12, the driver transistor 7 turns off so that the current having been supplied to the relay coil 4 is intercepted. The control signal CR is also supplied to the inverter circuit 12. The monostable circuit 10 connected to the inverter circuit 12 outputs an L level signal which is in turn inputted to the AND gate 13. The AND gate 13 supplies an L level signal to the AND gate 14 for the predetermined time period Tt.

When a drive current does not flow through the relay coil 4 the reed switch 3, if normal, will turn off. However, if the reed switch 3 always stays on because of some trouble such as sticking of burned contacts, the contact gap 22 will not open and maintains closed by all means. As a result, light from the LED 2 will not reach the phototransistor 6 which therefore always maintains an off state with its output being an H level. Accordingly, even if the control signal CR changes to an L level, the output of the phototransistor 6 maintains the H level. The Exclusive-OR circuit 9 therefore outputs an H level signal. The AND gate 14 outputs an H level signal at time t13 when the output of the AND gate 13 changes from the L level to an H level. As a result, the SR flip-flop circuit 15 receives the H level signal at its S terminal and is set. The SR flip-flop circuit 15 then sends from its Q output terminal an H level signal to the CPU on the tester side, to inform the abnormal state of the relay unit 16. The period indicated at b in FIG. 5 (B) corresponds to the period while the contacts of the reed switch are abnormally maintained on, and the signal indicated at f in FIG. 5 (G) represents an operation 'error detecting output.

After the operation error of the relay unit 16 is detected in the above manner, the tester restarts the checking operation or it executes an operation prepared for an abnormal state, i.e., it stops the operation of an apparatus providing the relay unit.

In the above description of the operation, the case where the reed switch 3 is forcibly maintained on by trouble has been given by way of example. On the contrary, the abnormal operation can also be checked for the case where the reed switch 3 is forcibly maintained off by some reason such as a defective driver transistor 7, a broken relay coil 4 or the like. Also in the latter case, the abnormal operation is checked using the SR flip-flop circuit 15 which is activated by an inconsistency between the control signal CR and the signal of the phototransistor 6.

As described above, checking the operation of the relay unit 16 can be performed while placing the relay unit at the stage of practical use. It is therefore possible to check the operation of the relay unit without lowering the operation rate. Furthermore, accidental operation errors which reappear less frequently can be found.

In the foregoing description, the reed switch 3 having a pair of contacts which turns on and off by power-on/off of the relay coil 4 has been used. Instead of a pair of contacts, this embodiment is applicable to a reed switch of a multi-contact type, i.e., a reed switch having two or more pairs of contacts disposed in parallel.

What is claimed is:

1. A relay device comprising:
    a relay element mounted on a circuit board, said relay element having a pair of contacts which are closed and electrically conducted by a control signal of a first level and opened by the control signal of a second level to form a contact gap;
    light emitting means for emitting light toward said contact gap;
    light receiving means for receiving light from said light emitting means, said light receiving means not receiving said light while said pair of contacts are closed, and receiving said light passing through said contact gap while said pair of contacts are opened; and
    checking means for checking if said relay device operates normally or abnormally in accordance with the relationship between an output from said light receiving means and the level of said control signal, further comprising:
    first logical means for executing a logical operation between an output from said light receiving means and said control signal;
    monostable multivibrator means for outputting an initial state of a first value and for outputting a pulse of a second value of a predetermined width when said control signal changes said level and recovering said initial state; and
    second logical means for executing a logical operation between outputs form said first logical means and said monostable multivibrator means.

2. A relay device according to claim 1, wherein said relay element includes a reed switch having said pair of contacts, and a relay coil externally applying a magnetic field to said reed switch to close said pair of contacts.

3. A relay device according to claim 2, wherein said relay coil is connected in series to a relay driver power source and a switching element, said switching element having a control terminal to which said control signal is applied, and said switching element turning on and off in accordance with a change of said control signal between said first and second levels.

4. A relay device according to claim 1, wherein said first logical means is an Exclusive-OR circuit, said second logical means is an AND circuit, and said monostable multivibrator means comprises:
    a first monostable circuit to which said control signal is directly applied;

a second monostable circuit to which said control signal is applied after said control signal is inverted; and an AND circuit for executing an AND operation between the outputs of said first and second monostable circuits.

5. A relay device according to claim 2, wherein said first logical means is an Exclusive-OR circuit, said second logical means is an AND circuit, and said monostable multivibrator means comprises:

a first monostable circuit to which said control signal is directly applied;

a second monostable circuit to which said control signal is applied after said control signal is inverted; and an AND circuit for executing an AND operation between the outputs of said first and second monostable circuits.

6. A relay device according to claim 3, wherein said first logical means is an Exclusive-OR circuit, said second logical means is an AND circuit, and said monostable multivibrator means comprises:

a first monostable circuit to which said control signal is directly applied;

a second monostable circuit to which said control signal is applied after said control signal is inverted; and an AND circuit for executing an AND operation between the outputs of said first and second monostable circuits.

7. A relay device according to claim 4, wherein said checking means includes a flip-flop circuit for receiving an output from said second logical means and holding said output.

8. A relay device according to claim 5, wherein said checking means includes a flip-flop circuit for receiving an output from said second logical means and holding said output.

9. A relay device according to claim 4, wherein said checking means includes a flip-flop circuit for receiving an output from said second logical means and holding said output.

10. A relay device comprising:

a relay element functioning as a switch for other circuits, mounted on a circuit board, said relay element having a pair of contacts which are closed and electrically conducted by a control signal of a first level and opened by the control signal of a second level to form a contact gap, and a relay coil externally applying a magnetic field to said switch to close said pair of contacts;

light emitting means mounted on the circuit board for emitting light toward said contact gap;

light receiving means mounted on the circuit board for receiving light from said light emitting means, said light receiving means not receiving said light while said pair of contacts are closed, and receiving said light passing through said contact gap while said pair of contacts are opened; and checking means for checking if said relay device operates normally or abnormally during normal relay operations in accordance with the relationship between an output from said light receiving means and the level of said control signal, both ends of said reed switch being electrically isolated from said light emitting means, light receiving means and checking means.

11. A relay device according to claim 10, wherein said relay coil is connected in series to a relay driver power source and a switching element, said switching element having a control terminal to which said control signal is applied, and said switching element turning on and off in accordance with a change of said control signal between said first and second levels.

12. A relay device according to claim 10, wherein said light receiving means is an optical switch.

13. A relay device according to claim 11, wherein said light receiving means is an optical switch.

14. A relay device according to claim 11, wherein said relay element includes a switch having said pair of contacts.

* * * * *